United States Patent [19]

Morota et al.

[11] Patent Number: 4,873,452
[45] Date of Patent: Oct. 10, 1989

[54] COLLISION DETECTOR FOR A VEHICLE

[75] Inventors: Makie Morota; Junichi Fukuda, both of Wako, Japan

[73] Assignee: Honda Giken Kogyo Kabushiki Kaisha, Tokyo, Japan

[21] Appl. No.: 247,559

[22] Filed: Sep. 22, 1988

[30] Foreign Application Priority Data

Dec. 23, 1987 [JP] Japan .................. 62-325769

[51] Int. Cl.$^4$ ............................................. B60R 21/08
[52] U.S. Cl. ................... 307/10.1; 307/9.1; 340/429; 340/436; 340/438; 180/274; 280/734; 280/735
[58] Field of Search .............. 307/9, 10 R, 105 B, 307/10 BP; 340/52 R, 52 H, 61, 62, 65, 66, 71, 72; 180/224, 268, 282, 286, 287, 271, 272; 280/731, 734, 735

[56] References Cited

U.S. PATENT DOCUMENTS

| | | | |
|---|---|---|---|
| 3,629,816 | 12/1971 | Gillund | 340/61 |
| 3,789,950 | 2/1974 | Strenglein | 340/61 X |
| 3,851,305 | 11/1974 | Baba et al. | 280/735 X |
| 3,870,894 | 3/1975 | Brede et al. | 180/274 X |
| 3,889,232 | 6/1975 | Bell | 340/61 X |
| 3,911,391 | 10/1975 | Held et al. | 280/735 X |
| 3,949,357 | 4/1976 | Hosaka | 180/274 X |
| 3,964,016 | 6/1976 | Yamada et al. | 180/274 X |
| 3,967,135 | 6/1976 | Balhan et al. | 340/52 H X |
| 4,308,452 | 12/1981 | Henderson | 340/52 R X |
| 4,410,875 | 10/1983 | Spies et al. | 280/735 X |
| 4,638,179 | 1/1987 | Mattes et al. | 307/105 B |

Primary Examiner—William M. Shoop, Jr.
Assistant Examiner—Paul Ip
Attorney, Agent, or Firm—Armstrong, Nikaido, Marmelstein, Kubovcik & Murray

[57] ABSTRACT

It is an object of the present invention to provide a collision detector for a vehicle, capable of avoiding the adverse effect of the diagnostic pulses on the detection of a collision so that the failure of the acceleration sensor can be diagnosed correctly. A collision detector in accordance with the present invention comprises a diagnostic pulse generator which applies diagnostic pulses to an acceleration sensor to detect the failure of the acceleration sensor, and a diagnostic circuit which stops the output diagnostic pulses of the diagnostic pulse generator when the output of the acceleration sensor exceeds a malfunction avoidance level which is lower than a reference collision level.

1 Claim, 2 Drawing Sheets

COLLISION DETECTOR FOR A VEHICLE

FIELD OF THE INVENTION

The present invention relates to a collision detector for a vehicle. The collision detector comprises an acceleration sensor for detecting the acceleration and deceleration of the vehicle, and a signal processing circuit which provides a collision signal when a value, based on the output of the acceleration sensor, exceeds a predetermined reference collision level.

BACKGROUND OF THE INVENTION

Japanese Patent Publication No. 59-8574 discloses a collision detector for a vehicle. This known collision detector, however, has a problem because it is possible that a collision signal can be erroneously provided due to the failure of the acceleration sensor. The applicant of the present application has previous proposed a diagnostic device for diagnosing the failure of the acceleration sensor. The diagnostic device constantly applies diagnostic pulses to the acceleration sensor and monitors the output of the acceleration sensor.

However, in some cases, the output of the acceleration sensor exceeds the reference collision level due to the superposition of the diagnostic pulses, or the superposition of the diagnostic pulses and a disturbance on the output of the acceleration sensor, even when the output of the acceleration sensor represents the acceleration of the vehicle, is below the reference collision level.

SUMMARY OF THE INVENTION

The present invention has been made in view of the foregoing problems. It is, therefore, an object of the present invention to provide a collision detector for a vehicle, capable of avoiding the adverse effect of the diagnostic pulses on the detection of a collision so that the failure of the acceleration sensor can be diagnosed correctly.

A collision detector in accordance with the present invention comprises a diagnostic pulse generator which applies diagnostic pulses to an acceleration sensor to detect the failure of the acceleration sensor, and a diagnostic circuit which stops the output diagnostic pulses of the diagnostic pulse generator when the output of the acceleration sensor exceeds a malfunction avoidance level which is lower than a reference collision level.

In the collision detector thus constituted, the output of the acceleration sensor will not exceed the reference collision level by a negligibly soft collision or a disturbance, because the diagnostic pulses are not applied to the acceleration sensor when the output of the acceleration sensor exceeds the malfunction avoidance level.

DESCRIPTION OF THE PREFERRED EMBODIMENTS

Figure 1:
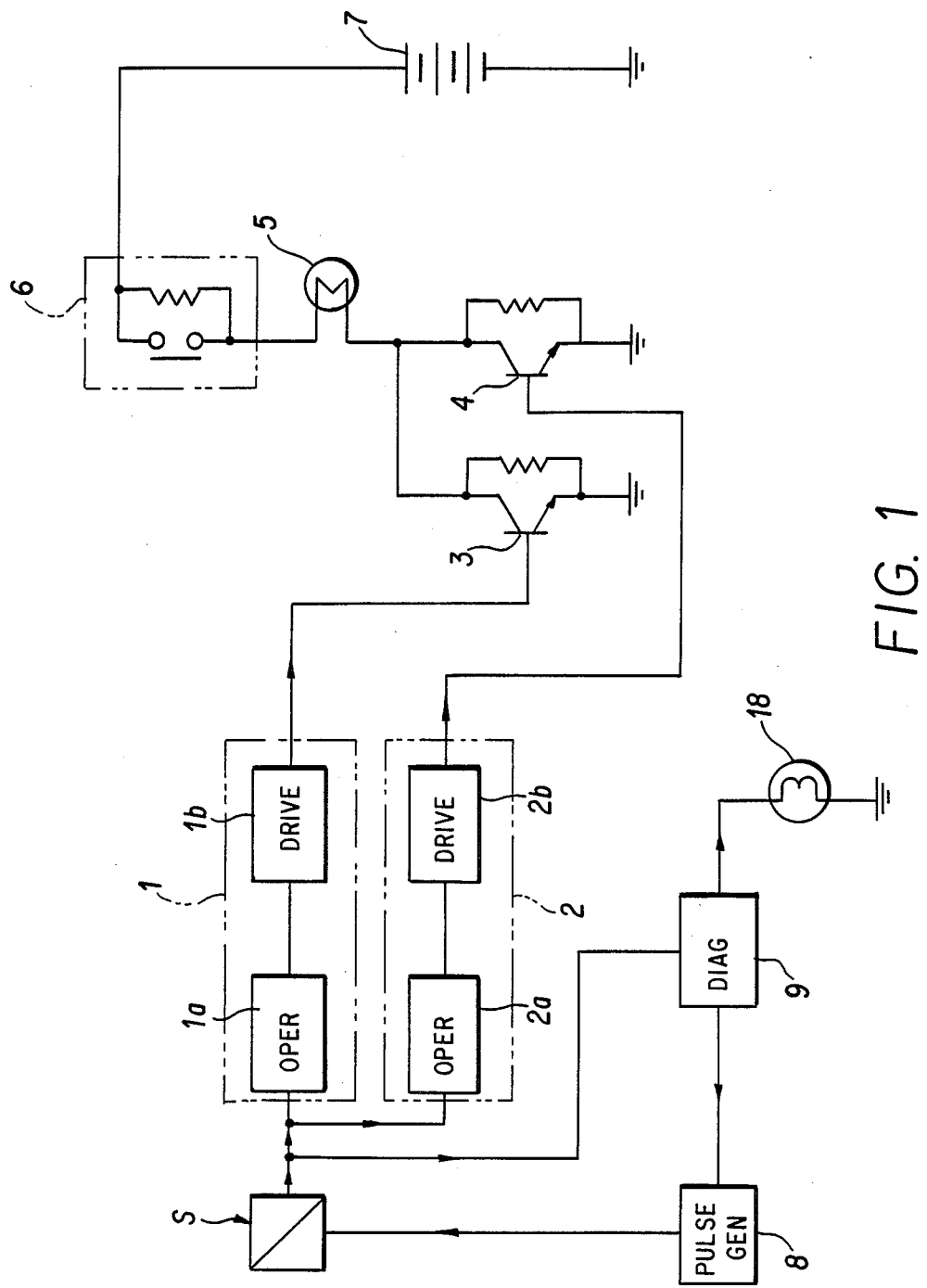
FIG. 1 is a general circuit diagram of a collision detector, in a preferred embodiment, according to the present invention.

A collision detector, in a preferred embodiment, according to the present invention will be described hereinafter with reference to the accompanying drawings as applied to a shock absorbing air bag actuating device for a vehicle. Referring to FIG. 1, the output of an acceleration sensor S is input to a first signal processing circuit 1 and a second signal processing circuit 2. When the signal processing circuits 1 and 2 determine that the vehicle has collided with an obstacle, transistors 3 and 4, connected respectively to the first and second signal processing circuits 1 and 2, are switched ON. The transistors 3 and 4 are connected in series to a detonator 5, while a mechanical acceleration sensor 6 and a power supply 7 are connected in series to the detonator 5. When at least one of the transistors 3 and 4 is switched ON and the mechanical acceleration sensor 6 connects the power supply 7 to the detonator 5 upon the detection of an acceleration exceeding a fixed value, the detonator 5 functions to actuate the shock absorbing air bag device.

The acceleration sensor S comprises a piezoelectric element and provides a negative voltage which increases in absolute value according to an increase of the detected acceleration. The output terminal of the acceleration sensor S is connected to the parallel circuit of the signal processing circuits 1 and 2. The signal processing circuits 1 and 2 are of a known constitution, respectively comprising series circuits of operating circuits 1a and 2a and driving circuits 1b and 2b. The signal processing circuits 1 and 2 provide HIGH signals, respectively, to switch ON the corresponding transistors 3 and 4 when a velocity obtained by integrating acceleration exceeds a predetermined reference collision level.

The acceleration sensor S has an input terminal to produce an inverse piezoelectric effect. Diagnostic pulses generated by a diagnostic pulse generator 8 are applied to the input terminal of the acceleration sensor S. Then, the acceleration sensor S generates an output voltage by the inverse piezoelectric effect in response to the diagnostic pulses.

The diagnostic pulse generator 8 is connected to a diagnostic circuit 9, which controls the diagnostic pulse generator 8 for continuing or stopping the generation of the diagnostic pulses according to the output signal of the acceleration sensor S. The connection of the principal circuit elements of the diagnostic circuit 9 are shown in FIG. 2.

Figure 2:
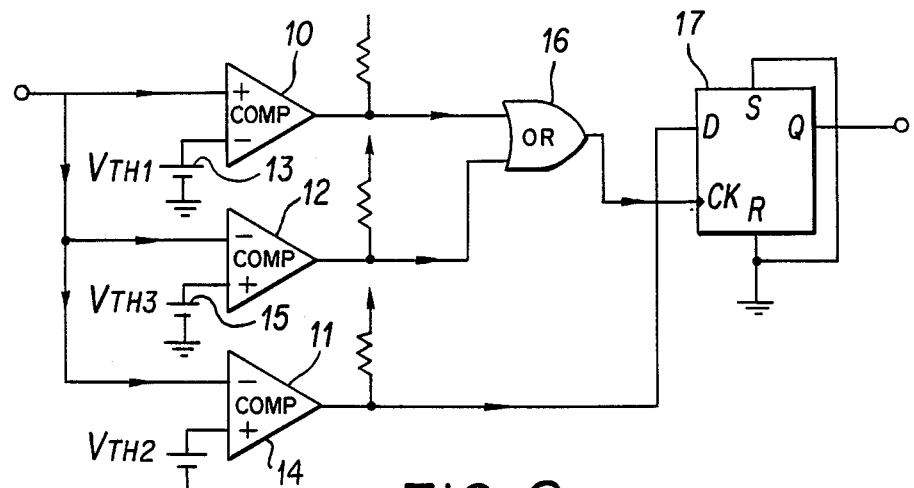
FIG. 2 is a circuit diagram showing the principal components of a diagnostic circuit incorporated in the collision detector of FIG. 1.
Figure 3:
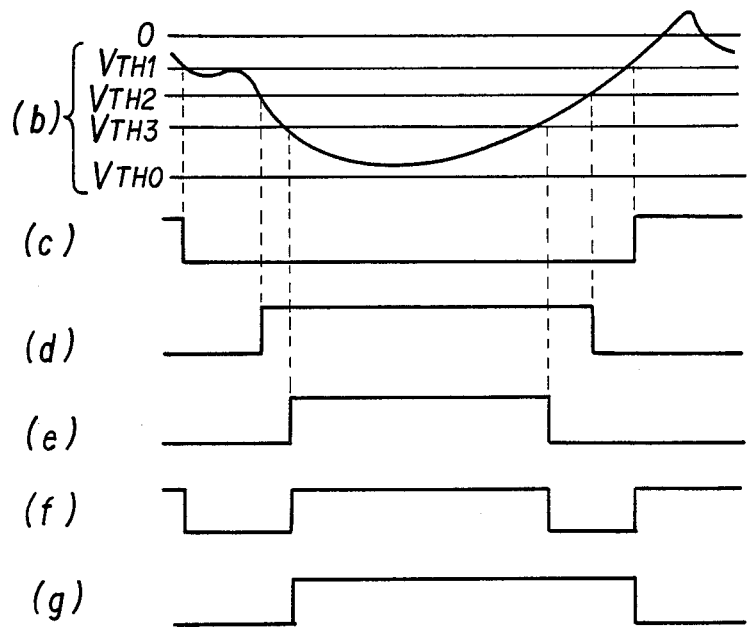
FIG. 3 is a time chart of an example of signals processed by the diagnostic circuit of FIG. 2.

Referring to FIG. 2, the output signal of the acceleration sensor S, namely, a negative voltage, is applied to the non-inverting terminal of the first comparator 10 and to the respective inverting terminals of a second comparator 11 and a third comparator 12. A first reference power supply 13, for defining a first threshold $V_{TH1}$, is connected to the inverting input terminal of the first comparator 10. A second reference power supply 14, for defining a second threshold $V_{TH2}$, is connected to the non-inverting terminal of the second comparator A third reference power supply, for defining a third threshold $V_{TH3}$, namely, a malfunction avoidance level, is connected to the non-inverting terminal of the third comparator 12. As shown in FIG. 3(b), $V_{TH1} > V_{TH2} > V_{TH3}$. The absolute value of the third threshold $V_{TH3}$ is smaller than a value $V_{TH0}$ corresponding to the reference collision level for the signal processing circuits 1 and 2. The second threshold $V_{TH2}$ is determined selectively so that the level of the output signal of the acceleration sensor S is between the second threshold $V_{TH2}$ and the third threshold $V_{TH3}$ in a normal state in which the acceleration sensor S is barely affected by disturbances.

The respective output terminals of the first comparator 10 and the third comparator 12 are connected to an OR circuit 16. The output terminal of the OR circuit 16 is connected to the clock input terminal CK of a flip-flop 17. The output terminal of the second comparator 11 is connected to the delay input terminal D of the flip-flop 17. An output signal, appearing at the output terminal Q of the flip-flop 17, is applied to the diagnostic pulse generator 8. When the output signal of the flip-flop 17 is LOW, the diagnostic pulse generator 8 generates the diagnostic pulses. The diagnostic pulse generator 8 stops generating the diagnostic pulses when the output signal goes HIGH.

An alarm lamp 18 (FIG. 1) is connected to the diagnostic circuit 9. The alarm lamp 18 is turned on when the output signal of the flip-flop 17 goes HIGH.

The operation of the collision detector thus constituted will be described herein after with reference to FIGS. 3(a) through 3(g). When the output signal of the acceleration sensor S varies, as shown in FIG. 3(b), while the diagnostic pulse generator 8 is generating pulses as shown in FIG. 3(a), the output signal of the first comparator 10, the output signal of the second comparator 11, the output signal of the third comparator 12, the output signal of the OR circuit 16 and the output signal of the flip-flop 17 vary as shown in FIGS. 3(c), 3(d), 3(e), 3(f) and 3(g), respectively.

That is, when the absolute value of the output signal of the acceleration sensor S is smaller than the first threshold $V_{TH1}$, the respective output signals of the first comparator 10 and the OR circuit 16 go HIGH, and the flip-flop 17 provides the output signal of the third comparator 12. When the absolute value of the output signal of the acceleration sensor S is greater than the first threshold $V_{TH1}$ and smaller than the second threshold $V_{TH2}$, the respective output signals of the first comparator 10 and the third comparator 12 go LOW, and hence the output signal of the OR circuit goes LOW. When the absolute value of the acceleration sensor S is greater than the second threshold $V_{TH2}$ and smaller than the third threshold $V_{TH3}$, the respective output signals of the comparators 10 and 12 go LOW, and hence the output signal of the OR circuit 16 goes LOW and the output signal of the second comparator 11 goes HIGH. When the, absolute value of the acceleration sensor S greater than the third threshold $V_{TH3}$, the respective output signals of the second comparator 11 and the OR circuit 16 go HIGH, and hence the output signal of the flip-flop 17 goes HIGH.

Thus, it is possible to detect whether or not the acceleration sensor S is operating normally by monitoring the level of the output signal of the acceleration sensor S provided in response to the diagnostic pulses applied to the acceleration sensor S by the diagnostic pulse generator 8. That is, while the output signal of the acceleration sensor S is between the second threshold $V_{TH2}$ and the third threshold $V_{TH3}$, it is determined that the acceleration sensor S is functioning normally. On the other hand, it is possible to determine whether or not the acceleration sensor is malfunctioning from the deviation of the output signal of the acceleration sensor S from the second threshold $V_{TH2}$ and the third threshold $V_{TH3}$. When the absolute value of the output signal of the acceleration sensor S is smaller than the second threshold $V_{TH2}$, due to the influence of disturbances, the absolute value of the output signal of the acceleration sensor S is restored to the normal level upon the disappearance of the disturbances. Hence, it is possible to determine that the acceleration sensor S is malfunctioning when the absolute value of the output signal of the acceleration sensor S is not restored to the normal level.

When the absolute value of the output signal of the acceleration sensor S exceeds the third threshold $V_{TH3}$, the output signal of the flip-flop 17 goes HIGH to stop the diagnostic pulse generating operation of the diagnostic pulse generator 8. Accordingly, in such a state, no diagnostic pulse is applied to the acceleration sensor S. Hence, the first signal processing circuit 1 and the second signal processing circuit 2 process the output signal of the acceleration sensor S corresponding to the acceleration and disturbances. Consequently, when a determination is made that the value obtained by processing the output signal of the acceleration sensor S is higher than the reference collision level, the transistors 3 and 4 are switched ON and the detonator 5 is activated, provided that the power supply 7 is connected to the detonator 5 by the mechanical acceleration sensor 6, to actuate the shock absorbing air bag device. On the other hand, when the transistors 3 and 4 are switched ON and the mechanical acceleration sensor 6 disconnects the detonator 5 from the power supply, it is possible that the acceleration sensor S is malfunctioning.

When the absolute value of the output signal of the acceleration sensor S exceeds the third threshold $V_{TH3}$ due to disturbances while the diagnostic pulses are applied to he acceleration sensor S, the diagnostic pulse generator 8 starts generating the diagnostic pulses again based upon the reduction of the absolute value of the output signal of the acceleration sensor S below the first threshold $V_{TH1}$ in a fixed time after the influence of the disturbances has disappeared.

Since the diagnostic pulse generator 8 applies the diagnostic pulses constantly to the acceleration sensor S and stops generating diagnostic pulses upon the increase of the absolute value of the output signal of the acceleration sensor S over the third threshold $V_{TH3}$, the accidental actuation of the shock absorbing air bag device, in response to an erroneous determination of a collision due to disturbances or the combined effect of a negligibly soft collision and the diagnostic pulses, is avoided. Furthermore, although the malfunction of the first signal processing circuit 1 and the second signal processing circuit 2 is not diagnosed, the parallel arrangement of the two signal processing circuits 1 and 2 maintains normal operation of the collision detector even if either the first signal processing circuit 1 or the second signal processing circuit 2 malfunctions. This avoids the necessity of a complicated circuit structure for diagnosing the malfunction of the signal processing circuits.

As apparent from the foregoing description, since the collision detector in accordance with the present invention comprises the diagnostic pulse generator for applying diagnostic pulses to the acceleration sensor to detect the malfunction of the acceleration sensor, and the diagnostic circuit for controlling the diagnostic pulse generator so as to stop generating the diagnostic pulses when the output signal of the acceleration sensor exceeds a predetermined malfunction avoidance level which is lower than a value corresponding to the reference collision level, the erroneous decision of a collision due to the effect of disturbances while the diagnostic pulses are applied to the acceleration sensor or due to the combined effect of the diagnostic pulses and a very soft collision of a level below the reference collision level, is avoided.

From the foregoing description of the preferred embodiment of the invention, it will be apparent that many modifications may be made therein. It should be understood that these embodiments are intended as one example of the invention only, and that the invention is not limited thereto. Therefore, it should be understood that the appended claims are intended to cover all modifications that fall within the true spirit and scope of the invention.

What we claim is:

1. A collision detector for a vehicle comprising:
   an acceleration sensor for detecting acceleration of the vehicle;
   signal processing circuit which provides a collision signal when a value, based on an output of the acceleration sensor, exceeds a predetermined reference collision level;
   a diagnostic pulse generator which applies diagnostic pulses to the acceleration sensor to detect a failure of the acceleration sensor; and
   a diagnostic circuit which stops an output of the output diagnostic oulses the diagnostic pulse generator when the output of the acceleration sensor exceeds a malfunction avoidance level which is lower than the predetermined reference collision level.

* * * * *